United States Patent
Song et al.

(10) Patent No.: US 10,546,882 B2
(45) Date of Patent: Jan. 28, 2020

(54) ARRAY SUBSTRATE AND MANUFACTURING METHOD THEREOF, DISPLAY PANEL AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Botao Song, Beijing (CN); Chengshao Yang, Beijing (CN); Yinhu Huang, Beijing (CN); Ning Liu, Beijing (CN); Jun Ma, Beijing (CA); Yunhai Wan, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/535,391

(22) PCT Filed: Jan. 5, 2017

(86) PCT No.: PCT/CN2017/070286
§ 371 (c)(1),
(2) Date: Jun. 12, 2017

(87) PCT Pub. No.: WO2017/185823
PCT Pub. Date: Nov. 2, 2017

(65) Prior Publication Data
US 2018/0197892 A1    Jul. 12, 2018

(30) Foreign Application Priority Data
Apr. 29, 2016 (CN) .......................... 2016 1 0276100

(51) Int. Cl.
*H01L 27/12* (2006.01)

(52) U.S. Cl.
CPC ...... *H01L 27/1244* (2013.01); *H01L 27/1262* (2013.01)

(58) Field of Classification Search
None
See application file for complete search history.

(56) References Cited

U.S. PATENT DOCUMENTS

2006/0001791 A1    1/2006   Hwang et al.
2013/0249820 A1*   9/2013   Woo .................. G06F 3/041
                                              345/173
(Continued)

FOREIGN PATENT DOCUMENTS

CN    1716065 A      1/2006
CN    202093289 U   12/2011
(Continued)

OTHER PUBLICATIONS

Office Action in Chinese Application No. 201610276100.6 dated Aug. 29, 2017, with English translation.
(Continued)

*Primary Examiner* — Alexander G Ghyka
(74) *Attorney, Agent, or Firm* — Womble Bond Dickinson (US) LLP

(57) ABSTRACT

The present disclosure provides an array substrate, a display panel comprising the array substrate, and a display device, as well as a manufacturing method of the array substrate. The array substrate comprises a base substrate, a metal layer arranged over the base substrate, a conductive material layer arranged on the metal layer, and a connection hole arranged over the conductive material layer to expose the conductive material layer.

7 Claims, 3 Drawing Sheets

(56) References Cited

U.S. PATENT DOCUMENTS

| 2014/0138717 | A1* | 5/2014 | Kong | G02F 1/133555 |
| | | | | 257/88 |
| 2014/0159073 | A1 | 6/2014 | Zhang | |
| 2016/3043735 | | 11/2016 | Chen et al. | |
| 2017/0040343 | A1 | 2/2017 | Hsin | |

FOREIGN PATENT DOCUMENTS

| CN | 103000627 A | 3/2013 |
| CN | 104681630 A | 6/2015 |
| CN | 104835782 A | 8/2015 |
| CN | 105870113 A | 8/2016 |

OTHER PUBLICATIONS

International Search Report and Written Opinion in PCT/CN2017/070286 dated Mar. 1, 2017, with English translation.
"Second office action," CN Application No. 201610276100.6 (Apr. 11, 2018).
Office Action received for Chinese Patent Application No. 201610276100.6, dated Sep. 19, 2018, 17 pages (9 pages of English Translation and 8 pages of Office Action).
International Preliminary Report on Patentability received for PCT Patent Application No. PCT/CN2017/070286, dated Nov. 8, 2018, 13 pages (7 pages of English Translation and 6 pages of Original Document).

* cited by examiner

ARRAY SUBSTRATE AND MANUFACTURING METHOD THEREOF, DISPLAY PANEL AND DISPLAY DEVICE

RELATED APPLICATION

The present application is the U.S. national phase entry of PCT/CN2017/070286, with an international filing date of Jan. 5, 2017, which claims the benefit of Chinese Patent Application No. 201610276100.6, filed on Apr. 29, 2016, the entire disclosure of which is incorporated herein by reference.

FIELD

The present disclosure generally relates to the field of display technology, and more particularly to an array substrate, a display panel comprising the array substrate and a display device, as well as a manufacturing method of the array substrate.

BACKGROUND

When manufacturing an array substrate of a display device, a metal pattern such as a signal line, a source/a drain, or the like is usually made of a metal such as aluminum or copper, and layers such as a gate insulating layer, an etching stop layer, a passivation layer, or the like are formed on the metal pattern, and then dry etching is performed on the respective layers on the metal pattern at positions corresponding to the metal pattern using a gas such as oxygen to form connection holes for exposing the metal pattern so as to electrically connect the metal pattern from the outside. However, under the conditions of dry etching, the gas such as oxygen for drying etching may react with the metallic material of the metal pattern, resulting in occurrence of a bulge-like defect in the metal pattern. It has been found in the subsequent processes that the bulge-like defect may cause a series of problems such as pad erosion, failure in bonding, and the like. Unfortunately, the bulge-like defect is difficult to improve by changing the conditions of dry etching, which will seriously affect the quality of the final product and reduce the yield of the final product.

In view of the above, there is a need in the art for providing an improved array substrate of a display device.

SUMMARY

It is an objective of the present disclosure to provide an array substrate, a display panel comprising the array substrate and a display device, as well as a manufacturing method of the array substrate, which can at least partially alleviating or eliminating one or more of the problems in the prior art as mentioned above.

According to a first aspect of the present disclosure, there is provided an array substrate comprising a base substrate, a metal layer arranged over the base substrate, a conductive material layer arranged on the metal layer, and a connection hole arranged over the conductive material layer to expose the conductive material layer.

In the above-described array substrate, by arranging the conductive material layer on the metal layer, during the process of etching the layers such as a gate insulating layer, a passivation layer and the like over the metal layer to form the connection hole, the conductive material layer protects the metal layer from being affected by etching, which consequently reduces or even avoids occurrence of a bulge-like defect in the metal layer, thereby improving the quality and yield of the final product.

In some embodiments, the conductive material layer may be in the same layer as the display driving electrode layer of the array substrate.

As compared to the prior art manufacturing process in which the display driving electrode layer is first formed and the metal layer is then formed, in this embodiment, the metal layer is first formed, and the display driving electrode layer and the conductive material layer are then formed in a same layer, so that occurrence of a bulge-like defect in the metal material of the metal layer can be avoided when the connection hole is being etched without increasing the layer number and thickness of the array substrate, thereby improving the quality of the final product.

In some embodiments, the array substrate comprises a thin film transistor, and the metal layer may comprise at least one of a source and a drain of the thin film transistor.

By forming the conductive material layer on the source and/or the drain of the thin film transistor, the source and/or the drain can be protected from quality degradation that results from being affected by etching during the process of etching the layers over the source and/or the drain to form the connection hole.

In some embodiments, the metal layer may comprise a signal line of the array substrate.

In some embodiments, the signal line may include a data line.

An array substrate of a display device generally comprises a plurality of mutually parallel gate lines and a plurality of mutually parallel data lines. The gate lines and the data lines intersect and define a plurality of pixel units. A thin film transistor TFT is arranged at each intersection of a gate line and a data line. By controlling turn-on and turn-off of the thin film transistor, it is possible to control the pixel unit corresponding to the thin film transistor to display a picture or not, thereby controlling the display device to display an image.

In some embodiments, the array substrate may further comprise a gate insulating layer arranged between the data line and the base substrate, and a passivation layer arranged over the conductive material layer, the connection hole being arranged in the passivation layer. In this case, the array substrate may be a bottom gate type array substrate, wherein a gate metal layer is located below a source/drain metal layer. The connection hole is used for electrically connecting the data line via the conductive material layer.

In some embodiments, the array substrate may further comprise a gate insulating layer and a passivation layer successively arranged over the conductive material layer, the connection hole being arranged in the gate insulating layer and the passivation layer. In such a case, the array substrate may be a top gate type array substrate, wherein a gate metal layer is located above a source/drain metal layer. Likewise, the connection hole is used for electrically connecting the data line via the conductive material layer.

In some embodiments, the conductive material layer may be in the same layer as a pixel electrode layer of the array substrate.

As compared to the prior art manufacturing process in which the pixel electrode layer is first formed and the data line is then formed, in this embodiment, the data line is first formed, and the pixel electrode layer and the conductive material layer are then formed in a same layer, so that occurrence of a bulge-like defect in the metal material of the data line can be avoided when the connection hole is being etched without increasing the layer number and thickness of the array substrate, thereby improving the quality of the final product.

In some embodiments, the signal line may comprise a common electrode line, and the array substrate may further comprise a gate insulating layer and a passivation layer arranged successively over the conductive material layer, the connection hole being arranged in the gate insulating layer and the passivation layer. In such a case, the array substrate may be a bottom gate type array substrate, wherein a gate metal layer is located below a source/drain metal layer. The connection hole is used for electrically connecting the common electrode line via the conductive material layer.

In some embodiments, the conductive material layer may be in the same layer as the common electrode layer of the array substrate.

As compared to the prior art manufacturing process in which the common electrode layer is first formed and the common electrode line is then formed, in this embodiment, the common electrode line is first formed, and the common electrode layer and the conductive material layer are then formed in a same layer, so that occurrence of a bulge-like defect in the metal material of the common electrode line can be avoided when the connection hole is being etched without increasing the layer number and thickness of the array substrate, thereby improving the quality of the final product.

In some embodiments, the conductive material layer may be made of a conductive oxide. For example, the conductive oxide may include one or more of an indium tin oxide (ITO), an aluminum-doped zinc oxide (AZO), an indium-doped zinc oxide (IZO), and an indium-doped cadmium oxide, wherein the indium tin oxide or the tin-doped indium oxide is currently known as the best and the most widely used transparent conductive oxide, which has been widely used due to its simplicity of being deposited as a thin film.

In some embodiments, the metal layer may be made of copper and/or aluminum.

To make a balance between the cost and the conductivity, aluminum is primarily used as a metal interconnect material in the conventional semiconductor manufacturing process. However, as the size of the transistor becomes smaller and smaller, devices manufactured using aluminum lines are beginning to be problematic in terms of reliability. Using a metal with smaller resistivity as the interconnection material and selecting a dielectric material with smaller dielectric constant are two main directions for reducing signal delay and improving the clock frequency. Since copper just has a resistivity of 1.67 $\mu\Omega$-cm, much smaller than 2.66 $\mu\Omega$-cm of aluminum, and can reduce the thickness of the interconnect layer, the effect of reducing signal delay is achieved by decreasing the capacitance. Therefore, if a low-K dielectric material is used in cooperation, the coupling capacitance between signal lines can be decreased, while the signal conversion speed is also increased, i.e. further reducing the signal delay. As a result, copper interconnect process comes into being. Nowadays, the copper interconnect technology has become a standard process for products of 90 nm or less.

According to a second aspect of the present disclosure, there is provided a display panel comprising the array substrate described in any one of the above embodiments.

According to a third aspect of the present disclosure, there is provided a display device comprising the above display panel.

In the above-described display panel and display device, by arranging the conductive material layer on the metal layer, during the process of etching the layers such as a gate insulating layer, a passivation layer and the like over the metal layer to form a connection hole, the conductive material layer protects the metal layer from being affected by etching, which consequently reduces or even avoids occurrence of a bulge-like defect in the metal layer, thereby improving the quality and yield of the final product.

According to a fourth aspect of the present disclosure, there is provided a manufacturing method of an array substrate. The method may comprise forming a metal layer over a base substrate, forming a conductive material layer on the metal layer, and forming a connection hole over the conductive material layer to expose the conductive material layer.

In the above-described manufacturing method of an array substrate, by forming the conductive material layer on the metal layer, during the subsequent process of etching the layers such as the gate insulating layer, the passivation layer and the like over the metal layer to form a connection hole, the conductive material layer protects the metal layer from being affected by etching, which consequently reduces or even avoids occurrence of a bulge-like defect in the metal layer, thereby improving the quality and yield of the final product.

In some embodiments, the conductive material layer and a display driving electrode layer of the array substrate may be simultaneously formed during one patterning process.

In some embodiments, the array substrate may comprise a thin film transistor, and the metal layer comprises at least one of a source and a drain of the thin film transistor.

In some embodiments, the metal layer may comprise a signal line of the array substrate. For example, the signal line includes a data line.

In some embodiments, the manufacturing method of an array substrate may further comprise forming a gate insulating layer over the base substrate prior to forming the conductive material layer, and forming a passivation layer over the conductive material layer, wherein the connection hole is formed in the passivation layer. The resulting array substrate may be a bottom gate type array substrate in which a gate metal layer is located below a source/drain metal layer. The connection hole is used for electrically connecting the data line via the conductive material layer.

In some embodiments, the manufacturing method of an array substrate may further comprise: forming a gate insulating layer and a passivation layer successively over the conductive material layer, wherein the connection hole is formed in the gate insulating layer and the passivation layer. The resulting array substrate may be a top gate type array substrate in which a gate metal layer is located above a source/drain metal layer. Likewise, the connection hole is used for electrically connecting the data line via the conductive material layer.

In some embodiments, the conductive material layer and a pixel electrode layer of the array substrate may be formed simultaneously during one patterning process.

In some embodiments, the signal line includes a common electrode line, and the manufacturing method of an array substrate may further comprise: forming a gate insulating layer and a passivation layer successively over the conductive material layer, wherein the connection hole is formed in the gate insulating layer and the passivation layer. The resulting array substrate may be a bottom gate type array substrate in which a gate metal layer is located below a source/drain metal layer. The connection hole is used for electrically connecting the common electrode line via the conductive material layer.

In some embodiments, the conductive material layer and a common electrode layer of the array substrate may be simultaneously formed during one patterning process.

It is to be noted that the second, third and fourth aspects of the present disclosure have similar or the same example implementations and benefits as the first aspect of the present disclosure, which are not described here for simplicity.

These and other aspects of the present disclosure will be apparent from and will be elucidated with reference to the embodiments described below.

DETAILED DESCRIPTION

Figure 1:
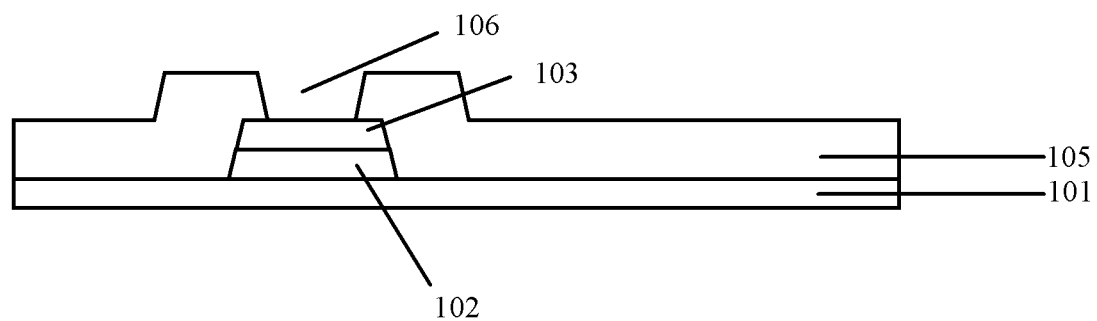
FIG. 1 is a cross-sectional view of a portion of an array substrate according to some embodiments of the present disclosure.

Exemplary embodiments of the present disclosure will be described in detail below with reference to the accompanying drawings. The drawings are illustrative and not drawn to scale, which are merely used to illustrate the embodiments of the present disclosure and are not intended to limit the scope of the present disclosure. In the drawings, like reference numerals denote the same or similar parts. In order to make the technical solution of the present disclosure clearer, the process steps and device structures well known in the art are omitted here.

FIG. 1 illustrates a cross-sectional view of a portion of an array substrate according to an embodiment of the present disclosure. As shown in FIG. 1, the array substrate comprises a base substrate 101, a metal layer 102 arranged over the base substrate, a conductive material layer 103 arranged on the metal layer 102, other layers 105 (which may include a plurality of sub-layers) arranged over the conductive material layer 103, and a connection hole 106 arranged over the conductive material layer 103 to expose the conductive material layer 103.

In the array substrate shown in FIG. 1, by arranging the conductive material layer 103 on the metal layer 102, during the process of etching the other layers 105 over the metal layer 102 to form the connection hole 106, the conductive material layer 103 protects the metal layer 102 from being affected by etching, which consequently reduces or even avoids occurrence of a bulge-like defect in the metal layer 102, thereby improving the quality and yield of the final product.

In the array substrate shown in FIG. 1, the conductive material layer 103 may be in the same layer as a display driving electrode layer (not shown in FIG. 1) of the array substrate.

As compared to the prior art manufacturing process in which the display driving electrode layer is first formed and the metal layer is then formed, in this embodiment, the metal layer is first formed, and the display driving electrode layer and the conductive material layer are then formed in the same layer, so that occurrence of a bulge-like defect in the metal material of the metal layer can be avoided when the connection hole is being etched without increasing the layer number and thickness of the array substrate, thereby improving the quality of the final product.

Figure 2:
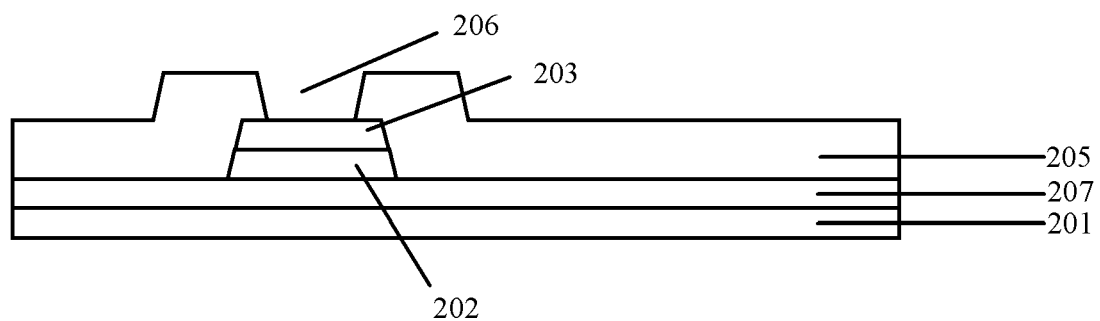
FIG. 2 is a cross-sectional view of a portion of an array substrate according to some embodiments of the present disclosure.

The metal layer 102 may comprise a signal line of the array substrate. For example, the signal line may include a data line. FIG. 2 illustrates a cross-sectional view of a portion of a bottom gate type array substrate according to an embodiment of the present disclosure. As shown in FIG. 2, the array substrate comprises a base substrate 201, a data line 202 arranged over the base substrate 201, a conductive material layer 203 arranged over the data line 202, a gate insulating layer 207 arranged between the data line 202 and the base substrate 201, a passivation layer 205 arranged over the conductive material layer 203, and a connection hole 206 formed in the passivation layer 205 to expose the conductive material layer 203. The connection hole 206 is used for electrically connecting the data line 202 via the conductive material layer 203.

In the array substrate shown in FIG. 2, by arranging the conductive material layer 203 on the data line 202, during the process of etching the passivation layer 205 over the data line 202 to form the connection hole 206, the conductive material layer 203 protects the data line 202 from being affected by etching, which consequently reduces or even avoids occurrence of a bulge-like defect in the data line 202, thereby improving the quality and yield of the final product.

Figure 3:
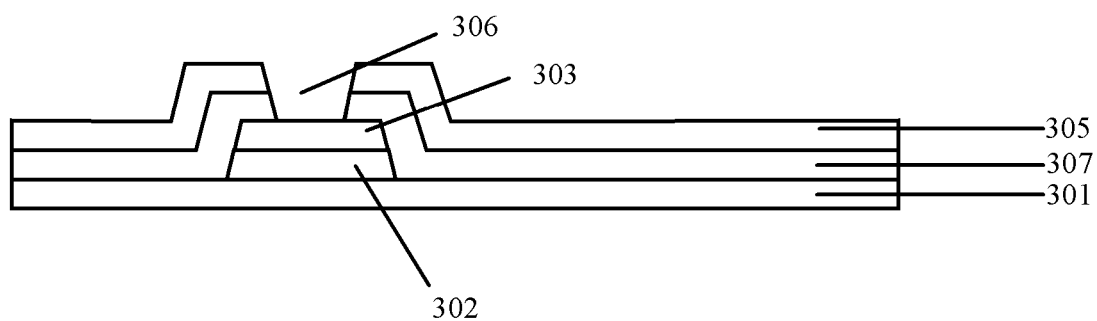
FIG. 3 is a cross-sectional view of a portion of an array substrate according to some embodiments of the present disclosure.

The inventive concept of the present disclosure is further applicable to a top gate type array substrate. FIG. 3 illustrates a cross-sectional view of a portion of a top gate type array substrate according to another embodiment of the present disclosure. As shown in FIG. 3, the array substrate comprises a base substrate 301, a data line 302 arranged over the base substrate 301, a conductive material layer 303 arranged on the data line 302, a gate insulating layer 307 and a passivation layer 305 arranged successively over the conductive material layer 303, and a connection hole 306 formed in the gate insulating layer 307 and the passivation layer 305 to expose the conductive material layer 303. The connection hole 306 is used for electrically connecting the data line 302 via the conductive material layer 303.

In the array substrate shown in FIG. 3, by arranging the conductive material layer 303 on the data line 302, during the process of etching the gate insulating layer 307 and the passivation layer 305 over the data line 302 to form the connection hole 306, the conductive material layer 303 protects the data line 302 from being affected by etching, which consequently reduces or even avoids occurrence of a bulge-like defect in the data line 302, thereby improving the quality and yield of the final product.

In the array substrates shown in FIGS. 2 and 3, the conductive material layer 203 and/or the conductive material layer 303 may be in the same layer as a pixel electrode layer (not shown) of the array substrate. As compared to the prior art manufacturing process in which the pixel electrode layer is first formed and the data line is then formed, in this embodiment, the data line is first formed, and the pixel electrode layer and the conductive material layer are then formed in the same layer, so that occurrence of a bulge-like defect in the metal material of the data line can be avoided when the connection hole is being etched without increasing the layer number and thickness of the array substrate, thereby improving the quality of the final product.

Figure 4:
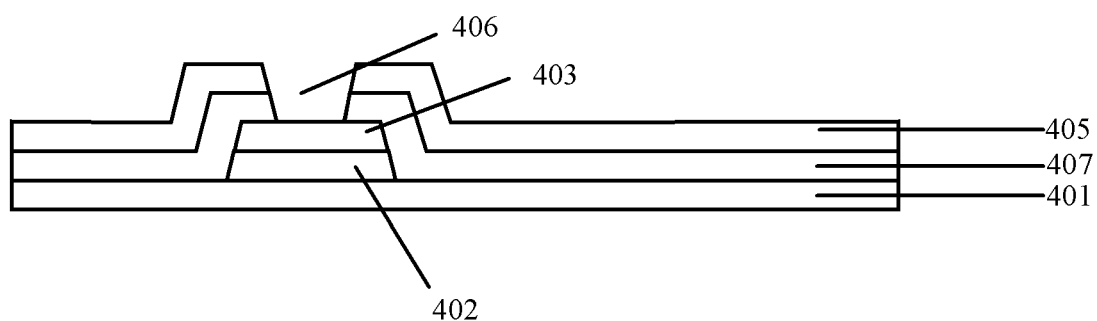
FIG. 4 is a cross-sectional view of a portion of an array substrate according to some embodiments of the present disclosure.

FIG. 4 is a cross-sectional view of a portion of a bottom gate type array substrate according to a further embodiment of the present disclosure. As show in FIG. 4, the array substrate comprises a base substrate 401, a common electrode line 402 arranged over the base substrate 401, a conductive material layer 403 arranged on the common electrode line 402, a gate insulating layer 407 and a passivation layer 405 arranged successively over the conductive material layer 403, and a connection hole 406 formed in the gate insulating layer 407 and the passivation layer 405 to expose the conductive material layer 403. The connection hole 406 is used for electrically connecting the common electrode line 402 via the conductive material layer 403.

In the array substrate shown in FIG. 4, by arranging the conductive material layer 403 on the common electrode line 402, during the process of etching the gate insulating layer 407 and the passivation layer 405 over the common electrode line 402 to form the connection hole 406, the conductive material layer 403 protects the common electrode line 402 from being affected by etching, which consequently reduces or even avoids occurrence of a bulge-like defect in the common electrode line 402, thereby improving the quality and yield of the final product.

In the array substrate shown in FIG. 4, the conductive material layer 403 may be in the same layer as a common electrode layer (not shown in FIG. 4) of the array substrate. As compared to the prior art manufacturing process in which the common electrode layer is first formed and the common electrode line is then formed, in this embodiment, the common electrode line is first formed, and the common electrode layer and the conductive material layer are then formed in the same layer, so that occurrence of a bulge-like defect in the metal material of the common electrode line can be avoided when the connection hole is being etched without increasing the layer number and thickness of the array substrate, thereby improving the quality of the final product.

Figure 5:
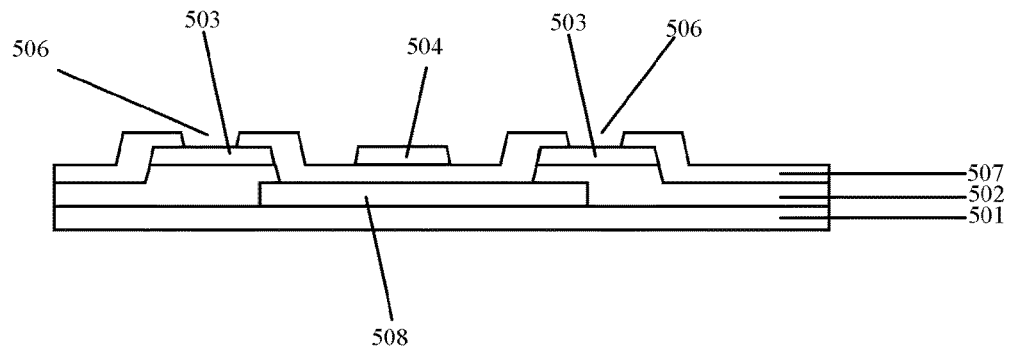
FIG. 5 is a cross-sectional view of a portion of an array substrate according to some embodiments of the present disclosure.

The array substrate shown in FIG. 1 may comprise a thin film transistor, and the metal layer 102 may comprise at least one of a source and a drain of the thin film transistor. FIG. 5 illustrates a cross-sectional view of a portion of an array substrate according to an embodiment of the present disclosure. As shown in FIG. 5, the array substrate comprises a base substrate 501, a source/a drain 502 arranged over the base substrate 501, an active region 508 arranged between the source and the drain 502, a conductive material layer 503 arranged on the source/the drain 502, a gate insulating layer 507 arranged over the conductive material layer 503, a connection hole 506 arranged in the gate insulating layer 507 to expose the conductive material layer 503, and a gate 504 arranged over the gate insulating layer 507. The connection hole 506 is used for electrically connecting the source/the drain 502 via the conductive material layer 503.

In the array substrate shown in FIG. 5, by forming the conductive material layer 503 on the source and/or the drain 502 of the thin film transistor, the source and/or the drain 502 can be protected from quality degradation that results from being affected by etching during the process of etching the gate insulating layer 507 over the source and/or the drain 502 to form the connection hole 506.

In one or more of the above embodiments, the conductive material layer is made of a conductive oxide. For example, the conductive oxide may include one or more of an indium tin oxide, an aluminum-doped zinc oxide, an indium-doped zinc oxide, and an indium-doped cadmium oxide. In addition, one or more of the metal layer 102, the data lines 202, 302, the common electrode line 402, and the source/the drain 502 may be made of copper and/or aluminum.

Figure 6:
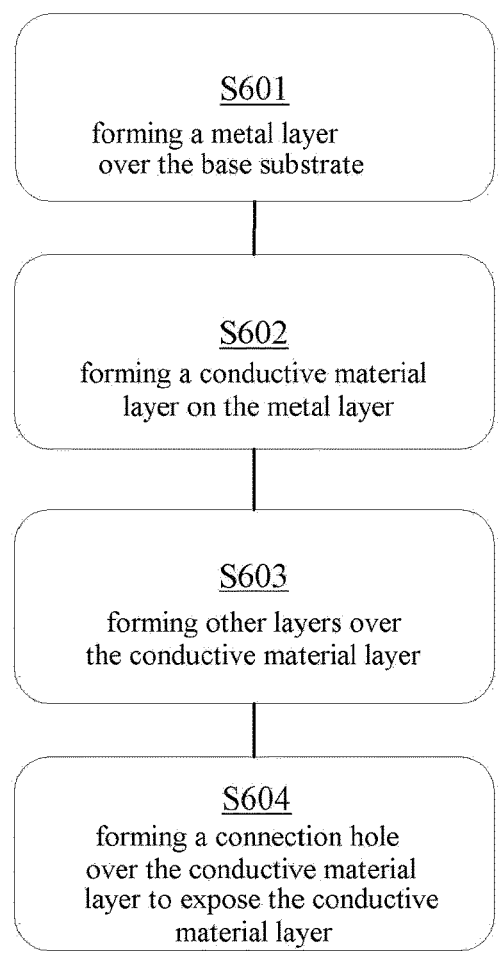
FIG. 6 shows a flow chart of a method of manufacturing an array substrate according to some embodiments of the present disclosure.

FIG. 6 illustrates a flow chart of a manufacturing method of an array substrate according to embodiments of the present disclosure, and FIGS. 7a-7d schematically illustrate the steps of the manufacturing method.

Figure 7A:
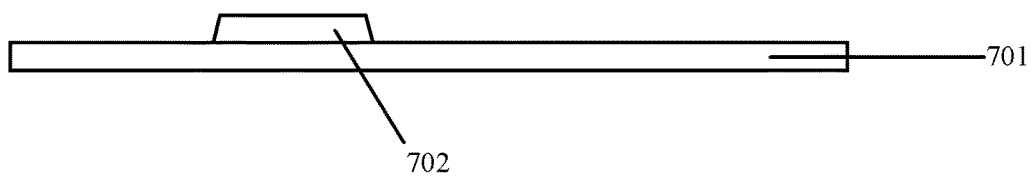
FIGS. 7a-7d are schematic views illustrating the steps of the method of manufacturing an array substrate as shown in FIG. 6.

In step S601, as shown in FIG. 7a, a metal layer 702 is formed over a base substrate 701. The metal layer 702 may be made by sputtering, vapor deposition, photolithography, peeling, and so on.

Figure 7B:
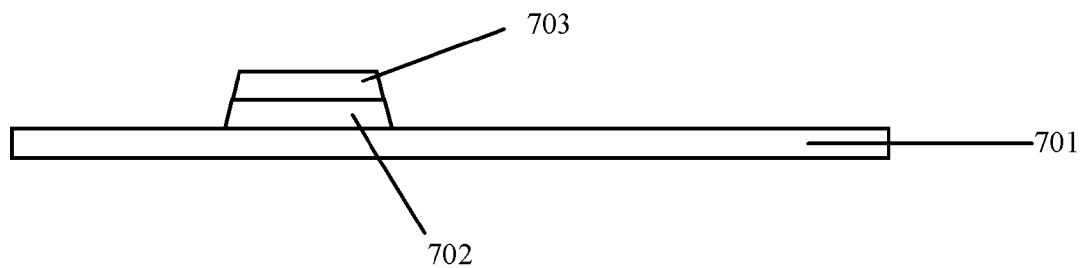

In step S602, as shown in FIG. 7b, a conductive material layer 703 is to formed on the metal layer 702. The conductive material layer 703 may be made by spin coating, photolithography, peeling, and so on.

Figure 7C:
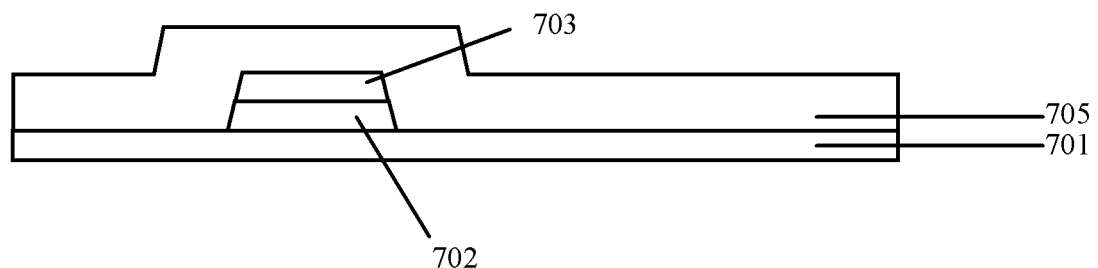

In step S603, as shown in FIG. 7c, other layers 705 are formed over the conductive material layer 703. The other layers 705 may include a plurality of sub-layers, such as the gate insulating layer, the passivation layer, and the like as mentioned above.

Figure 7D:
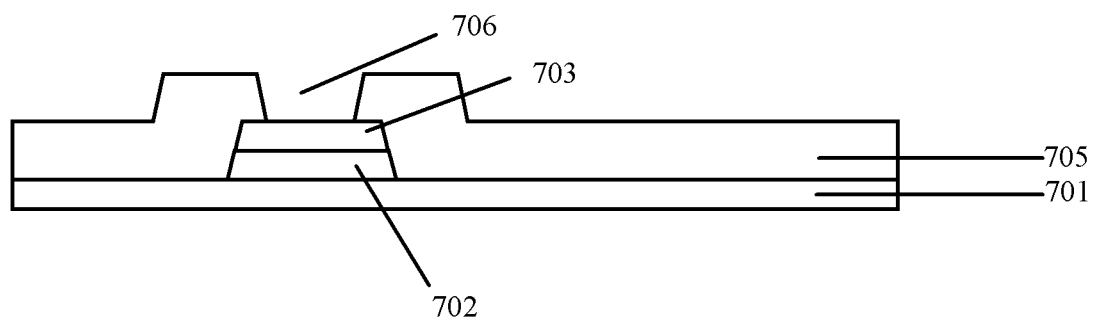

In step S604, as shown in FIG. 7d, the other layers 705 over the metal layer 702 are etched using dry etching to form a connection hole 706 that exposes the conductive material layer 703.

In the above-described manufacturing method of an array substrate, by forming the conductive material layer on the metal layer, during the subsequent process of etching the layers such as the gate insulating layer, the passivation layer and the like over the metal layer to form the connection hole, the conductive material layer protects the metal layer from being affected by etching, which consequently reduces or even avoids occurrence of a bulge-like defect in the metal layer, thereby improving the quality and yield of the final product.

Optionally, the conductive material layer and a display driving electrode layer of the array substrate are formed simultaneously during one patterning process.

Optionally, the metal layer comprises a data line, and the manufacturing method of an array substrate may further comprise: forming a gate insulating layer over the base substrate prior to forming the conductive material layer, and forming a passivation layer over the conductive material layer, wherein the connection hole is formed in the passivation layer. The resulting array substrate may be a bottom gate type array substrate in which a gate metal layer is located below a source/drain metal layer. The connection hole is used for electrically connecting the data line via the conductive material layer.

Optionally, the manufacturing method of an array substrate may further comprise: forming a gate insulating layer and a passivation layer successively over the conductive material layer, wherein the connection hole is formed in the gate insulating layer and the passivation layer. The resulting array substrate may be a top gate type array substrate in which the gate metal layer is located over the source/drain metal layer. Likewise, the connection hole is used for electrically connecting the data line via the conductive material layer.

Optionally, the conductive material layer and a pixel electrode layer of the array substrate are formed simultaneously during one patterning process.

Optionally, the metal layer comprises a common electrode line, and the manufacturing method of an array substrate further comprises: forming a gate insulating layer and a passivation layer successively over the conductive material layer, wherein the connection hole is formed in the gate insulating layer and the passivation layer. The resulting array substrate may be a bottom gate type array substrate in which the gate metal layer is located below the source/drain metal layer. The connection hole is used for electrically connecting the common electrode line via the conductive material layer.

Optionally, the conductive material layer and a common electrode layer of the array substrate are simultaneously formed during one patterning process.

The present disclosure further provides a display panel and a display device comprising the array substrate described in any one of the above embodiments.

The concept of the present disclosure can be widely applied to any system having display function, including a desktop computer, a laptop computer, a mobile phone, a tablet computer, and the like. In addition, although several embodiments have been described in detail above, other modifications are possible. For example, the flow chart described above does not require a desired result to be achieved in the particular order or sequence as described. Other steps may be provided, or steps may be removed from the described flow, and other components may be added to the described system or removed from the described system. Other embodiments may be within the scope of the present disclosure. Numerous variations and modifications may be made by those skilled in the art without departing from the spirit and scope of the present disclosure in view of the teachings of the present disclosure.

The invention claimed is:

1. An array substrate comprising
a base substrate;
a metal layer arranged over the base substrate;
a protective conductive material monolayer arranged on the metal layer; and
a connection hole arranged over the protective conductive material monolayer to expose the protective conductive material monolayer,
wherein
the metal layer comprises a data line, and
the protective conductive material monolayer is in a same layer as a pixel electrode layer of the array substrate.

2. The array substrate according to claim 1, wherein the conductive material monolayer is in a same layer as a display driving electrode layer of the array substrate.

3. The array substrate according to claim 1, wherein the array substrate comprises a thin film transistor, and the metal layer comprises at least one of a source and a drain of the thin film transistor.

4. The array substrate according to claim 1, wherein the array substrate further comprises a gate insulating layer arranged between the data line and the base substrate and a passivation layer arranged over the protective conductive material monolayer, the connection hole being arranged in the passivation layer.

5. The array substrate according to claim 1, wherein the array substrate further comprises a gate insulating layer and a passivation layer arranged successively over the conductive material monolayer, the connection hole being arranged in the gate insulating layer and the passivation layer.

6. The array substrate according to claim 1, wherein the conductive material monolayer is made of a conductive oxide wherein the conductive oxide includes one or more of an indium tin oxide, an aluminum-doped zinc oxide, an indium-doped zinc oxide and an indium-doped cadmium oxide.

7. A display panel comprising the array substrate according to claim 1.

* * * * *